(12) United States Patent
Chinbe et al.

(10) Patent No.: US 7,547,175 B2
(45) Date of Patent: Jun. 16, 2009

(54) TRANSFER DEVICE FOR SUBSTRATE AND STORING DEVICE AND HAND THEREIN, AND SUBSTRATE HANDLED BY THE DEVICE

(75) Inventors: Hiroshi Chinbe, Amagasaki (JP); Yoshiya Endo, Amagasaki (JP); Naoki Shimakawa, Amagasaki (JP); Ichiro Fukuwatari, Amagasaki (JP); Yoshiaki Hayashida, Amagasaki (JP); Yoshio Takakura, Amagaski (JP); Akio Matsuyama, Taki-gun (JP); Hideto Kohketsu, Matsusaka (JP)

(73) Assignees: Hitachi Plant Technologies, Ltd., Tokyo (JP); Sharp Corporation, Osaka (JP)

( * ) Notice: Subject to any disclaimer, the term of this patent is extended or adjusted under 35 U.S.C. 154(b) by 1357 days.

(21) Appl. No.: 10/179,855

(22) Filed: Jun. 26, 2002

(65) Prior Publication Data

US 2002/0197139 A1    Dec. 26, 2002

(30) Foreign Application Priority Data

| Jun. 26, 2001 | (JP) | ............................. 2001-192674 |
| Dec. 14, 2001 | (JP) | ............................. 2001-380891 |
| May 30, 2002  | (JP) | ............................. 2002-157122 |

(51) Int. Cl.
  *B65B 21/02* (2006.01)
  *B65G 65/04* (2006.01)
  *H01L 21/677* (2006.01)

(52) U.S. Cl. ............... 414/416.03; 414/938; 414/217.1; 414/416.08

(58) Field of Classification Search ............ 414/416.03, 414/416.08, 937–938, 941, 254, 331, 217, 414/217.1; 294/1.1
See application file for complete search history.

(56) References Cited

U.S. PATENT DOCUMENTS

| 5,044,752 | A  | * | 9/1991  | Thurfjell et al. | ............. 356/400 |
| 5,116,182 | A  | * | 5/1992  | Lin | ............................ 414/254 |
| 5,183,370 | A  | * | 2/1993  | Cruz | ..................... 414/416.03 |
| 5,730,574 | A  | * | 3/1998  | Adachi et al. | .......... 414/225.01 |
| 6,152,677 | A  | * | 11/2000 | Tateyama et al. | ........... 414/738 |
| 6,203,617 | B1 | * | 3/2001  | Tanoue et al. | ................ 118/695 |
| 6,213,704 | B1 | * | 4/2001  | White et al. | ................. 414/217 |

FOREIGN PATENT DOCUMENTS

| JP | 09-208008   | 8/1997 |
| JP | 2001-093969 | 4/2001 |

* cited by examiner

*Primary Examiner*—Eileen D. Lillis
*Assistant Examiner*—Gregory W Adams
(74) *Attorney, Agent, or Firm*—Wenderoth, Lind & Ponack, L.L.P.

(57) ABSTRACT

A transfer device for a substrate is capable of preventing deformation or breakage of the substrate due to bending stress by reducing the amount of dead weight deflection of the substrate, e.g. a large mother glass board. Supporting members extend in opposite directions from two sides of a storage device such that the substrate can be introduced or removed by raising and lowering the hand of a transfer machine inserted into the storage device between the supporting members. The supporting members are comprised of a plurality of supporting members in parallel, formed with a gap between the supporting members facing each other. The hand is comprised of a plurality of transverse hand supporting members extending in the direction of breadth, positioned between the parallel supporting members, and a longitudinal hand supporting member extending in the direction of length and positioned between the supporting members facing each other and connecting the transverse hand supporting members at the lifting position of the hand.

14 Claims, 10 Drawing Sheets

TRANSFER DEVICE FOR SUBSTRATE AND STORING DEVICE AND HAND THEREIN, AND SUBSTRATE HANDLED BY THE DEVICE

BACKGROUND OF THE INVENTION

The present invention relates to a transfer device for a substrate, more specifically a transfer device for a substrate capable of preventing deformation or breakage due to bending stress, by reducing the amount of substrate dead weight deflection in items such as large mother glass boards, etc., which includes a storage device.

Mother glass boards such as liquid crystal, etc. are stored in special storage devices such as mother glass board storing cassettes, etc., so they may be stored separately to avoid contact with one another. The mother glass board storage cassette is used for both transporting and temporarily storing liquid crystal mother glass boards between manufacturing systems, for example, on large mother glass board manufacturing lines.

Figure 9:
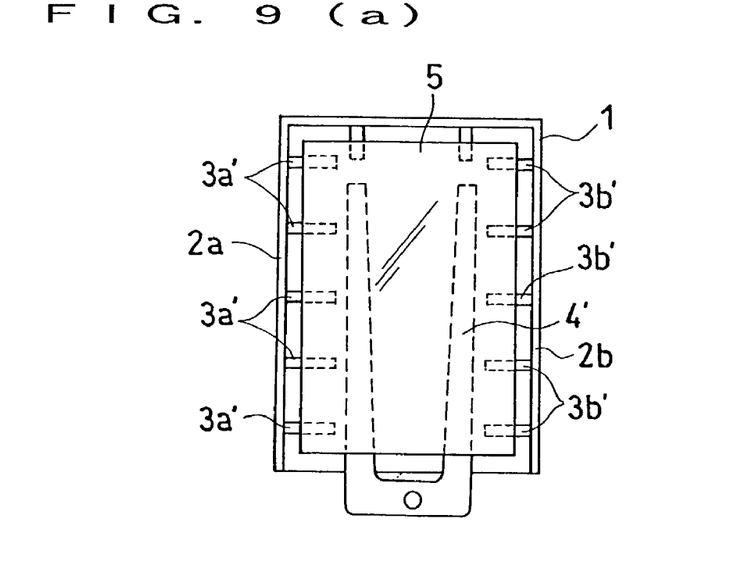

The mother glass board storage cassette is provided with a plurality of supporting members 3a', 3b' disposed in parallel in opposite directions, extending from two side walls 2a, 2b of a box-shaped cassette body 1, as shown in FIG. 9. It is designed in such a way as to introduce or remove mother glass boards 5 by raising and lowering a hand 4' of a transfer machine inserted in the cassette body 1 between the supporting members 3a', 3b'.

The cassette body 1 requires a large space at the center, in the direction of the breadth of the cassette body 1, to enable the raising and lowering of the dichotomous fork-shaped hand 4'. It is therefore formed in such a way that the supporting members 3a', 3b' protrude a comparatively short distance from the left and right side walls 2a, 2b. In such case, it is arranged so that the mother glass boards 5 stored in the cassette body 1 are supported by the supporting members 3a', 3b' provided extending from the left and right side walls 2a, 2b of the cassette body 1, to reduce dead weight deflection of the mother glass boards 5 stored there.

Moreover, for the hand 4' of a transfer machine used to introduce and remove the mother glass boards 5 to and from the cassette body 1, the dimension L in the direction of the breadth of the hand 4' is fixed to avoid an increase of mother glass board 5 deflection when the mother glass boards 5 are raised with the hand 4'.

However, with the progress in recent years of a general trend toward larger and thinner mother glass boards, even mother glass boards of high rigidity have come to produce excessive deflection. As a result, with the conventional mother glass boards storing cassettes, the length of supporting members is restricted to short distances, the dead weight deflection of mother glass boards 5 has increased and the mother glass boards themselves are subject to increased bending stress because of this deflection, presenting problems of deformation or breakage.

Figure 10:
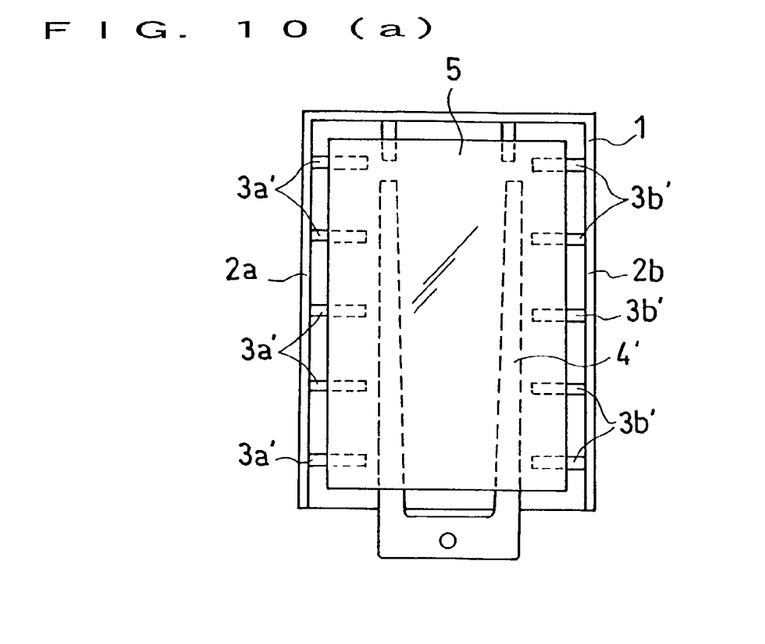

Thus, as shown in FIG. 10, while the mother glass board 5 stored in the cassette body 1 is subject to a large dead weight bending force as the size of the mother glass board 5 becomes larger than that in FIG. 9, the dimension 1 in the direction of the breadth of the hand 4' must be reduced to allow the supporting members 3a', 3b' to extend to the center in the direction of the breadth of the mother glass board 5 to correct this bending.

However, if the dimension 1 in the direction of the breadth of the hand 4' is reduced, the deflection of the mother glass board 5 placed on the hand 4' becomes as indicated by the dotted line in FIG. 10 (c). The mother glass board 5 is then subject to a great bending force, allowing it to be easily deformed or broken.

SUMMARY OF THE INVENTION

The objective of the present invention, realized in view of the problems with conventional transfer devices for a substrate, is to provide a transfer device for a substrate capable of preventing deformation or breakage of the substrate due to bending stress by reducing the amount of dead weight deflection on substrates such as large mother glass boards, etc., which includes a storage device.

To achieve the objective, the transfer device for a substrate according to this first invention is a transfer device for substrate provided with supporting members in opposite directions disposed in extension from two sides of a storage device. It is designed in such a way as to introduce or remove substrates by raising and lowering the hand of a transfer machine inserted into the storage device between the supporting members. The supporting members are comprised of a plurality of supporting members in parallel formed with a gap between the supporting members facing each other. The hand is comprised of a plurality of transverse hand supporting members in the direction of breadth positioned between the parallel supporting members and a longitudinal hand supporting member positioned between the supporting members facing each other and connecting the transversal hand supporting members to each other, at the lifting position of the hand.

In this case, the hand may be comprised of a plurality of transverse hand supporting members in the direction of breadth which can pass through the gap between parallel supporting members and a pair of longitudinal hand supporting members, provided side by side with a gap in the direction of breadth, connecting said transversal hand supporting members to each other, at the lifting position of the hand.

Moreover, to achieve the same objective, the transfer device for substrate according to this second invention is a transfer device for substrate provided with supporting members in opposite directions disposed in extension from two sides of the storage device, and designed in such a way as to introduce or remove mother glass boards by raising and lowering the hand of a transfer machine inserted in the storage device between the supporting members. An auxiliary supporting member is provided at an intermediate position between the supporting members, and the hand is comprised of a plurality of transverse hand supporting members in the direction of breadth positioned between the parallel supporting members and of a pair of longitudinal hand supporting members, provided side by side with a gap in the direction of breadth connecting the transversal hand supporting members to one another, at the lifting position of the hand.

Furthermore, to achieve the same objective, the transfer device for substrate according to this third invention is a transfer device for substrate provided with supporting members in opposite directions disposed in extension from two sides of the storage device in such a way as to introduce or remove mother glass boards by raising and lowering the hand of a transfer machine inserted into the storage device between the supporting members. An auxiliary supporting member is provided at an intermediate position between the supporting members. The hand is comprised of a pair of wide longitudinal hand supporting members, provided side by side with a gap in the direction of breadth.

The storage device used for the transfer device for substrate according to the first invention is a storage device provided with supporting members in opposite directions disposed in extension from two sides and designed in such a way as to introduce or remove mother glass boards by raising and lowering the hand of a transfer machine inserted into the storage device between the supporting members. The supporting members are comprised of a plurality of supporting members in parallel formed with a gap between the supporting members facing each other and formed by providing, between the supporting members facing each other, a gap enabling the passage of a longitudinal hand supporting member in the direction of length connecting a plurality of transverse hand supporting members in the direction of breadth positioned between the parallel supporting members to each other, at the lifting position of the hand.

In such a case, the supporting members may be formed in the same shape and vertically disposed in a plurality of stages inside the storage device.

Also, it is possible to provide either an auxiliary longitudinal hand supporting member between a pair of wide longitudinal hand supporting members in parallel with the latter, or an auxiliary supporting member in parallel at an intermediate position of the supporting members provided in extension in opposite directions from both sides of the storage device.

Moreover, a cushioning member may be provided at the top face of the supporting members, directly supporting the substrate.

This transfer device for substrate and the storage device used for it can expand the support area of the substrate with the supporting member of the storage device or the hand supporting member of the transfer machine for a wide range of substrate, and can prevent deformation or breakage of substrate due to bending stress by reducing the amount of dead weight deflection of large-sized substrate.

It should be noted that by comprising the hand of the transfer machine with a pair of longitudinal hand supporting members, provided side-by-side with a gap in the direction of breadth, it becomes possible for the hand to maintain a high rigidity, even if the hand is formed of small thickness, and can thus increase the number of substrate pieces per unit capacity of the storage device by reducing the insertion space of the hand.

Moreover, by forming said supporting members in the same shape and vertically disposing them in a plurality of stages inside the storage device, it becomes possible to store a large number of mother glass boards in the cassette.

Furthermore, by providing an auxiliary longitudinal hand supporting member and an auxiliary supporting member in parallel, it becomes possible to handle substrates of larger size.

Still more, by further providing a cushioning member directly supporting a substrate at the top face of the supporting members, the transfer of substrate can be performed smoothly.

The transfer device for a substrate and storing device enables handling a liquid crystal glass substrate of a size no smaller than 1200×1000 mm, or even no smaller than 2000×1700 mm.

BRIEF DESCRIPTION OF THE DRAWINGS

FIG. 9 indicates a conventional transfer device for substrate, FIG. 9(*a*) being a plan view omitting a top plate, FIG. 9(*b*) being a front elevation, and FIG. 9(*c*) being an explanatory drawing showing the relationship between the dimension in the direction of breadth of a hand and the deflection of a mother glass board.

FIG. 10 indicates a conventional transfer device for a large-sized substrate, FIG. 10(*a*) being a plan view omitting the top plate, FIG. 10(*b*) being a front elevation, and FIG. 10(*c*) being an explanatory drawing showing the relationship between the dimension in the direction of breadth of the hand and the deflection of a mother glass board.

DETAILED DESCRIPTION OF THE INVENTION

Embodiments of a transfer device for a substrate and a storing device therein according to the present invention will be explained hereafter as an example in which a mother glass board is an object to be transferred, based on drawings.

Figure 1:
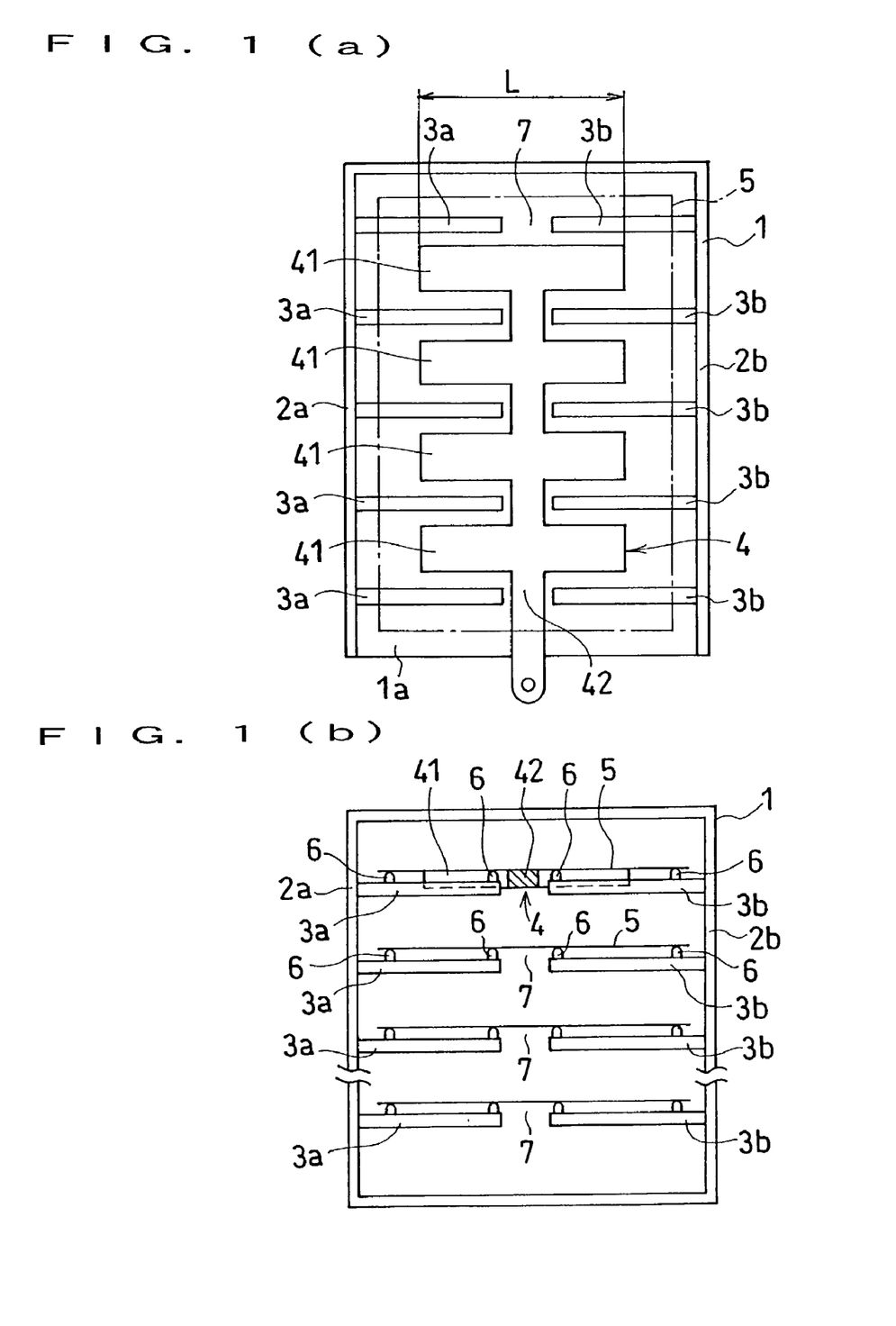
FIG. 1 indicates a first embodiment of a transfer device for a substrate according to the present invention, FIG. 1(*a*) being a plan view omitting the top plate, and FIG. 1(*b*) being a front elevation.
Figure 2:
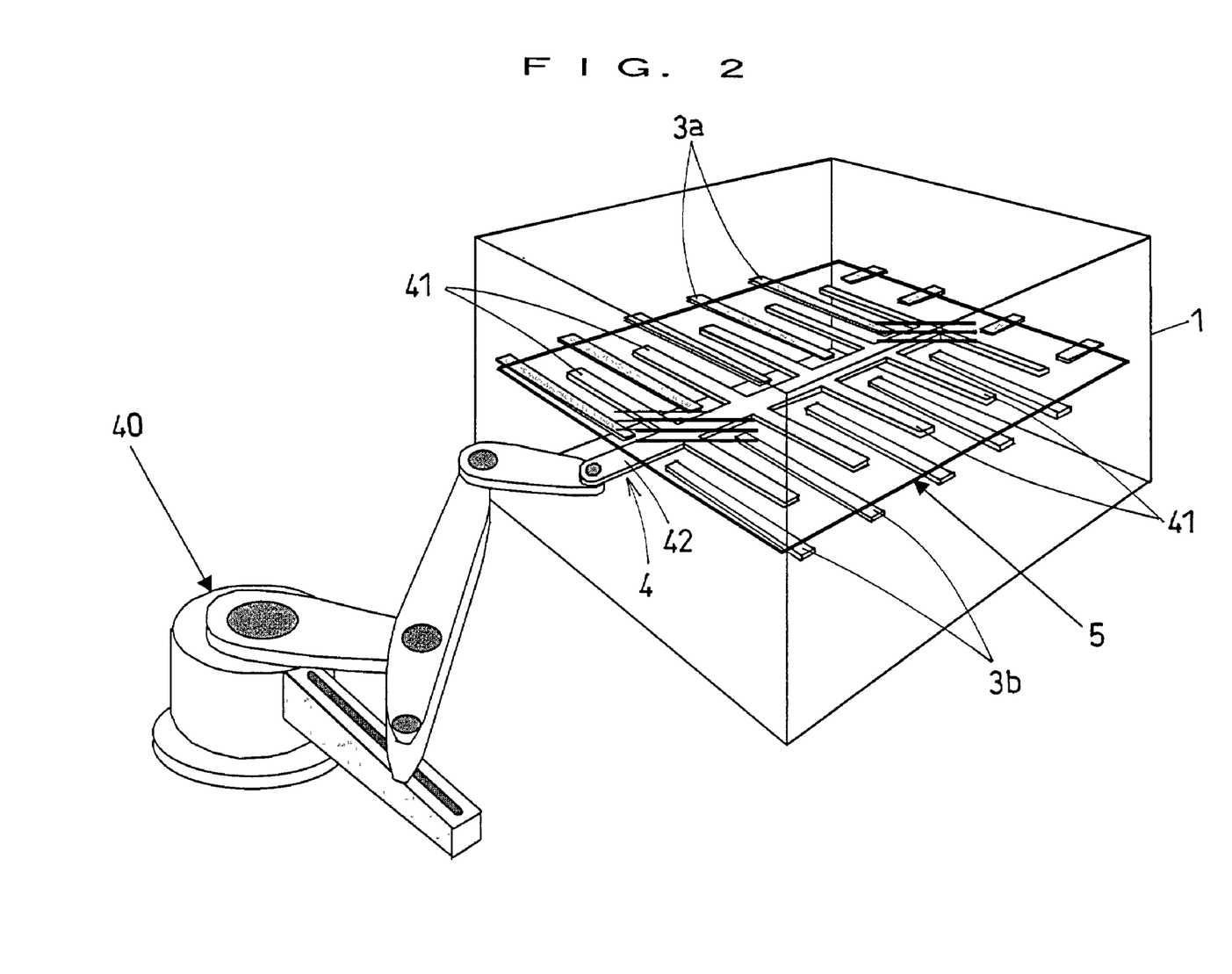
FIG. 2 is a perspective view showing the transfer device for a substrate in the same embodiment as above.

FIGS. 1~2 indicate a first embodiment of the transfer device for a substrate and the storage device used for it according to the present invention.

The transfer device for a substrate, used in combination with other transfer devices, is provided with a plurality of supporting members 3*a*, 3*b* disposed in parallel in opposite directions in extension from two side walls 2*a*, 2*b* on the left and right of a box-shaped cassette body 1. It is comprised in such a way as to introduce or remove the mother glass board 5 by raising and lowering the hand 4 of a transfer machine 40 inserted into the cassette body 1 between the supporting members 3*a*, 3*b*.

In this embodiment the supporting members 3*a*, 3*b* for the mother glass board 5 are formed with a gap 7 between the supporting members 3*a*, 3*b* facing each other. The hand 4 is comprised of a plurality of transverse hand supporting members 41 extending in the direction of breadth of the hand 4, positioned between parallel supporting members 3*a* or 3*b*, and a longitudinal hand supporting member 42 extending in the direction of length and positioned between the supporting members 3*a*, 3*b* facing each other at the lifting position of the hand 4. The transverse hand supporting members 41 are connected to each other by the member 42.

Moreover, the supporting members 3a, 3b are formed in the same shape and disposed vertically in a plurality of stages inside the cassette body 1.

The supporting members 3a, 3b are installed on the same plane, to support one sheet of mother glass board 5 in a horizontal position, and disposed in parallel in 5 pieces each on the left and right side walls 2a, 2b respectively, so that the supporting members 3a, 3b of the left and right side walls 2a, 2b may come to the same position in the direction of depth, as shown in FIG. 1 (a). The supporting members 3a, 3b of the left and right side walls 2a, 2b extend up horizontally to near the center in the direction of breadth of the cassette body 1.

Furthermore, provided at the top of the supporting members 3a, 3b are cushioning members 6 in the shape of a projection (or in the shape of a protruding bar) formed using an elastic body such as synthetic rubber, for example, directly supporting the mother glass board 5, as shown in FIG. 1 (b). In this embodiment, in a pair of supporting members 3a, 3b on the left and right, the mother glass board 5 is supported at total of 4 points, 2 points near the center and 2 points near the end, but it may also be supported by no less than 6 points.

In this way, the supporting members 3a, 3b extending to near the center in the direction of breadth of the cassette body 1 can reduce the amount of dead weight deflection of the mother glass board 5, thereby preventing breakage of the mother glass board 5 due to bending stress at the time of storage.

The transverse hand supporting members 41 and the longitudinal hand supporting member 42 of the hand 4 are formed integrally on the same plane in order to transfer the mother glass board 5 horizontally. The transverse hand supporting members 41 and the longitudinal hand supporting member 42 are formed at positions that do not interfere with the supporting members 3a, 3b in the lifting position of the hand 4.

The transverse hand supporting members 41 consist of a sheet-like material extending from the center in the direction of breadth of the cassette body 1 to the left and right side walls 2a, 2b. The longitudinal hand supporting member 42 consists of a long sheet-like material connecting the plurality of transverse hand supporting members 41 to each other at the center in the direction of breadth of the cassette body 1.

By comprising such transverse hand supporting members 41 and a longitudinal hand supporting member 42, the hand 4 can transfer a large mother glass board 5 in such a way as to reduce the amount of dead weight deflection of the mother glass board 5, preventing breakage of the mother glass board 5 due to bending stress at the time of transfer.

In addition, on the transfer device for substrate of this embodiment, the supporting members 3a, 3b supporting the mother glass board 5 are formed with a prescribed gap 7 between the supporting members 3a, 3b facing each other. The hand 4 is comprised of the plurality of transverse hand supporting members 41 disposed between parallel supporting members 3a or 3b and the longitudinal hand supporting member 42 disposed between the supporting members 3a, 3b facing each other and connecting the transverse hand supporting members 41 to each other, at the insertion position of the hand 4, as shown in FIG. 1. This makes it possible to extend the supporting members 3a, 3b to near the center of the mother glass board 5, to thereby store a large mother glass board 5 in such a way as to reduce the amount of deflection by its own dead weight and prevent breakage of the mother glass board 5 due to bending stress at the time of storage.

By forming the hand 4 of the transfer machine, at the insertion position of the hand 4, with a plurality of transverse hand supporting members 41 in the direction of breadth disposed between parallel supporting members 3a or 3b, and a longitudinal hand supporting member 42 disposed between the supporting members 3a, 3b facing each other and connecting the transverse hand supporting members 41 to each other, it becomes possible to increase the dimension L in the direction of breadth of the hand 4 toward the end part of the mother glass board 5. A large mother glass board 5 is thereby stored in such a way as to reduce the amount of its dead weight deflection and prevent breakage of the mother glass board 5 due to bending stress at the time of transfer.

Note that the transfer device for a substrate of this embodiment can effectively store and transfer liquid crystal mother glass boards 5 of 1200×1000 mm or so in size, and also of no less than 2000×1700 mm in size, if required.

Next, the second embodiment of the transfer device for substrate and storage device according to the present invention will be explained with reference to FIG. 3.

This transfer device for substrate is provided, in the same way as the first embodiment, with a plurality of supporting members 3a or 3b disposed in parallel in opposite directions in extension from two side walls 2a, 2b on the left and right of the box-shaped cassette body 1. A mother glass board 5 is introduced or removed by raising and lowering the hand 4 of a transfer machine inserted into the cassette body 1 between the supporting members 3a, 3b.

The supporting members 3a, 3b of the mother glass board 5 are formed with a prescribed gap 7 between the supporting members 3a, 3b facing each other. The hand 4 is comprised of a plurality of transverse hand supporting members 41 positioned between the parallel supporting members 3a or 3b and a longitudinal hand supporting member 42 positioned between the supporting members 3a, 3b facing each other and connecting the transverse hand supporting members 41 to each other at the lifting position of the hand 4.

Furthermore, the supporting members 3a, 3b are formed in the same shape and vertically disposed in a plurality of stages inside the cassette body 1.

Figure 3:
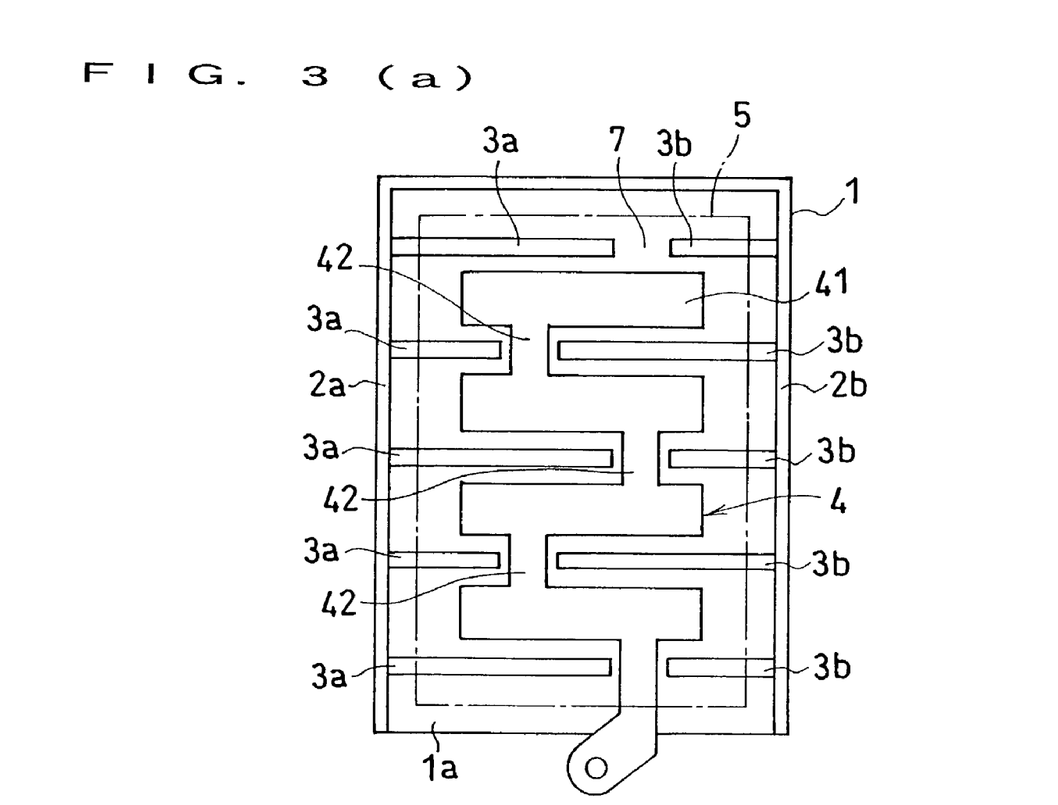
FIG. 3 indicates a second embodiment of the transfer device for substrate according to the present invention, FIG. 3(*a*) being a plan view omitting the top plate, and FIG. 3(*b*) being a front elevation.

The supporting members 3a, 3b are installed on the same plane to support the mother glass board 5 in a horizontal position and disposed in parallel in 5 pieces each on the left and right side walls 2a, 2b respectively, so that the supporting members 3a, 3b of the left and right side walls 2a, 2b may come to the same position in the direction of depth, as shown in FIG. 3 (a).

Also, the supporting members 3a, 3b of the left and right side walls 2a, 2b are formed in such a way as to have a prescribed gap 7 between the supporting members 3a, 3b facing each other. The position of this gap 7 is displaced alternately, left and right in the direction of depth, from the opening 1a of the cassette body 1.

Therefore, while the supporting member 3a on the left side wall 2a is formed longer than the supporting member 3b on the right side wall 2b at the first, third and fifth supporting members 3a, 3b from the opening 1a, the supporting member 3b of the right side wall 2b is formed longer than the supporting member 3a on the left side wall 2a at the second and fourth supporting members 3a, 3b.

It should be noted that the top of the supporting members 3a, 3b are provided with cushioning members directly supporting the mother glass board 5 in the same way as in the first embodiment, as shown in FIG. 3 (b).

These supporting members 3a, 3b are extended alternately, and can further reduce the amount of dead weight deflection of the mother glass board 5 by dispersing the position of the gaps 7 between the supporting members 3a, 3b, to thereby prevent breakage of the mother glass board 5 due to bending stress at the time of storage.

Also, the transverse hand supporting members 41 and the longitudinal hand supporting member 42 of the hand 4 are formed integrally on the same plane in order to transfer the mother glass board 5 horizontally.

The transverse hand supporting members 41 consist of a sheet-like material extended from the center in the direction of breadth of the cassette body 1 to the left and right side walls 2a, 2b.

The longitudinal hand supporting member 42 consists of a long sheet-like material connecting the plurality of transverse hand supporting members 41 in a zigzag pattern at the position of the gap 7 between the supporting members 3a, 3b.

By having the transverse hand supporting members 41 and the longitudinal hand supporting member 42 displaced alternately, the hand 4 can further reduce the amount of dead weight deflection of the mother glass board 5 to thereby prevent breaking of the mother glass board 5 due to bending stress at the time of transfer.

Figure 4:
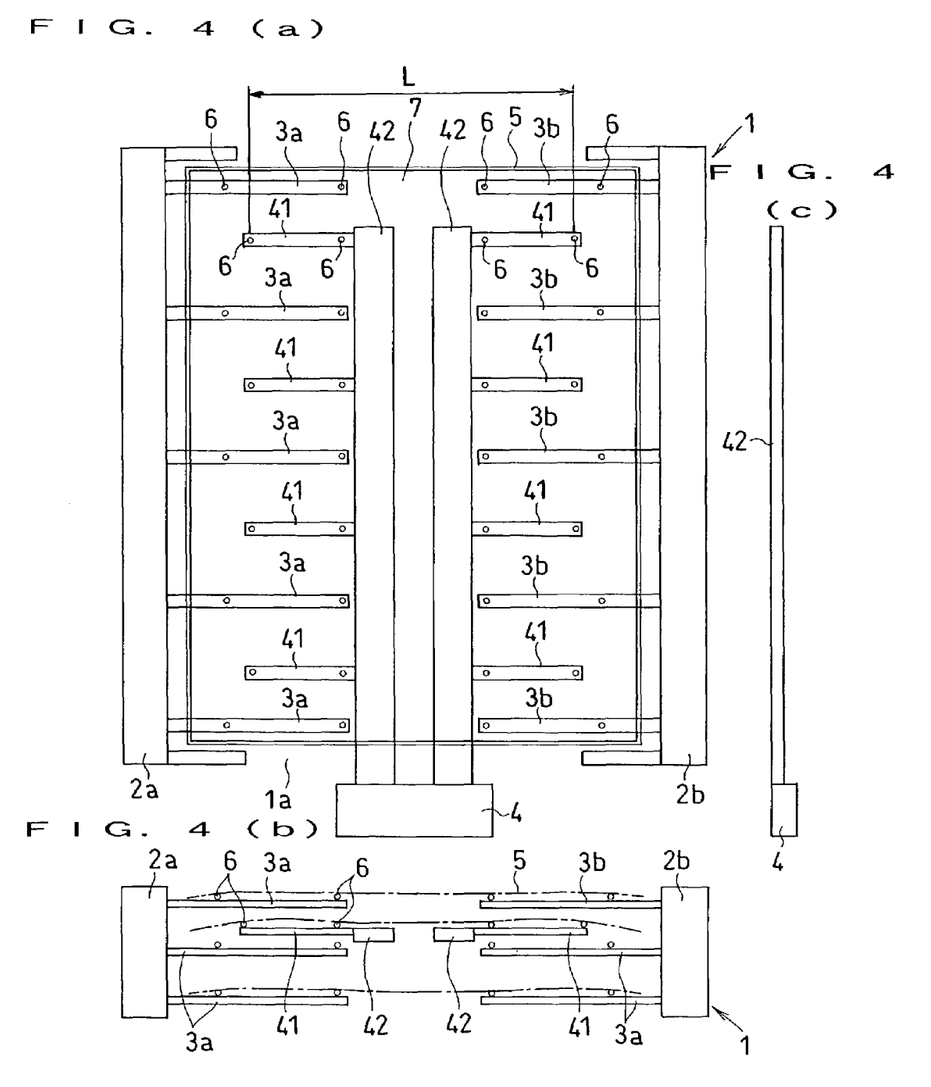
FIG. 4 indicates a state of transfer to a cassette body by a transfer device in the third embodiment of the transfer device for a substrate according to the present invention, FIG. 4(*a*) being a plan view omitting the top plate, FIG. 4(*b*) being a front elevation, and FIG. 4(*c*) being a side view of the longitudinal hand supporting member of the hand.
Figure 5:
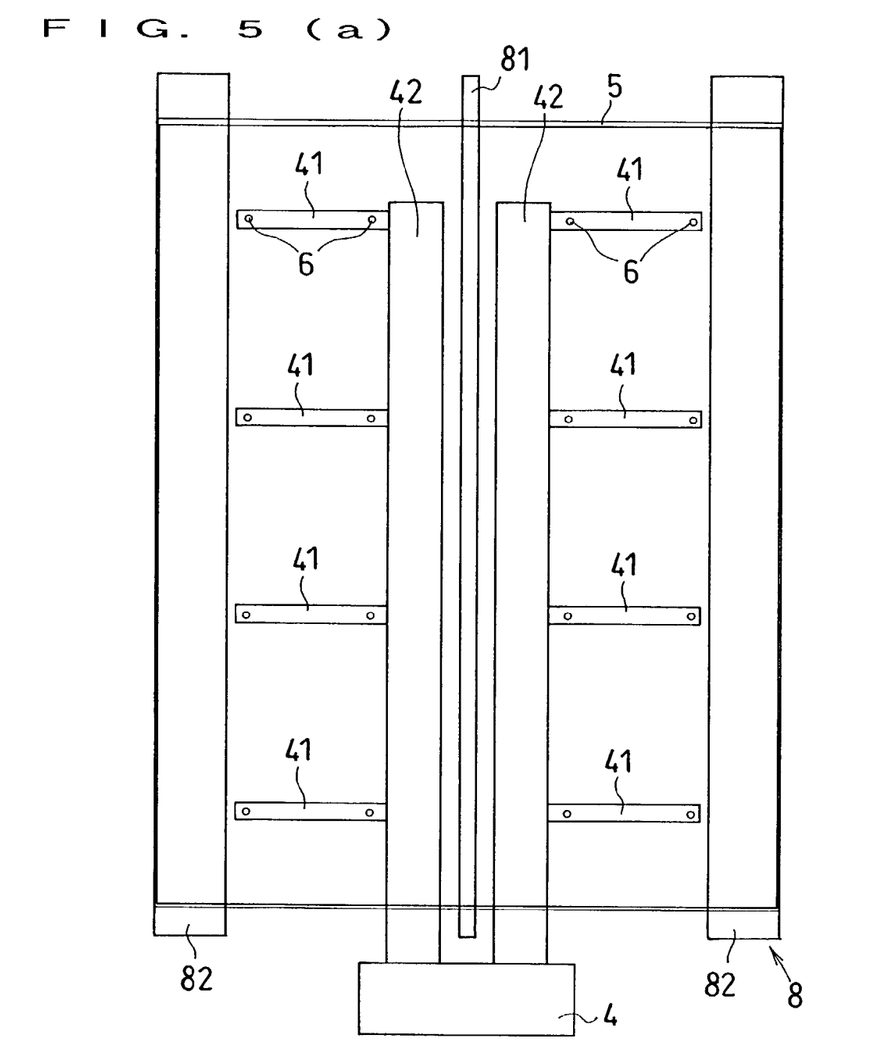
FIG. 5 indicates a state of transfer to a pedestal with the same transfer device as above, FIG. 5(*a*) being a plan view, and FIG. 5(*b*) being a front elevation.

Next, FIGS. 4~5 indicate the third embodiment of the transfer device for substrate and storage device according to the present invention.

This transfer device for a substrate, intended for (transferring) mother glass boards and used in combination with other transfer devices, is provided with a plurality of supporting members 3a, 3b disposed in parallel in opposite directions in extension from two side walls 2a, 2b on the left and right sides of the box-shaped cassette body 1 as a storage device. A mother glass board 5 is introduced or removed by raising and lowering the hand 4 of a transfer machine (not illustrated) inserted into the cassette body 1 between the supporting members 3a, 3b.

In this embodiment, supporting members 3a, 3b of the mother glass board 5 are formed with a gap 7 at a prescribed dimension between the supporting members 3a, 3b facing each other. The hand 4 is comprised of a plurality of transverse hand supporting members 41 in the direction of breadth which can pass through the gap between parallel supporting members 3a or 3b and a pair of longitudinal hand supporting members 42, provided in parallel with a gap in the direction of breadth between the supporting members 3a, 3b facing each other, and connecting between the left and right transversal hand supporting members 41 at the lifting position of the hand 4.

The supporting members 3a, 3b are formed in the same shape and disposed vertically in a plurality of stages inside the cassette body 1.

The supporting members 3a, 3b are installed on the same plane to support one sheet of mother glass board 5 in a horizontal position, and disposed in parallel in 5 pieces each on the left and right side walls 2a, 2b, respectively. The supporting members 3a, 3b of the left and right side walls 2a, 2b may come to the same position in the direction of depth, as shown in FIG. 4 (a).

In addition, the supporting members 3a, 3b of the left and right side walls 2a, 2b are extended horizontally up to near the center in the direction of breadth of the cassette body 1.

Furthermore, provided on the top face of the supporting members 3a, 3b are cushioning members 6 directly supporting the mother glass board 5, as shown in FIG. 4 (b). In this embodiment, on a pair of supporting members 3a, 3b on the left and right, the mother glass board 5 is supported at 4 points in total or 2 points near the center and 2 points near the end, but it may also be supported by no less than 6 points.

In this way, the supporting members 3a, 3b, extending to near the center in the direction of breadth of the cassette body 1, can reduce the amount of dead weight deflection of the mother glass board 5 to thereby prevent deformation or breakage of the mother glass board 5 due to bending stress at the time of storage.

The transverse hand supporting members 41 and the longitudinal hand supporting member 42 of the hand 4 are formed integrally on the same plane in order to transfer the mother glass board 5 horizontally. The transverse hand supporting members 41 and longitudinal hand supporting member 42 are formed at positions not interfering with the supporting members 3a, 3b in the lifting position of the hand 4.

The transverse hand supporting members 41 consist of a sheet-like material extending from the center in the direction of breadth of the cassette body 1 up the left and right side walls 2a, 2b.

The longitudinal hand supporting member 42 consists of a long sheet-like material provided in parallel with a gap of prescribed dimension in the direction of breadth, the respective longitudinal hand supporting member 42 connecting the left and right transversal hand supporting members 41 to each other.

By comprising such transverse hand supporting members 41 and the longitudinal hand supporting member 42, the hand 4 can transfer a large mother glass board 5 in such a way as to reduce the amount of dead weight deflection of the mother glass board 5, so as to prevent deformation or breakage of the mother glass board 5 due to bending stress at the time of transfer.

As described above, on the transfer device for substrate of this embodiment, the supporting members 3a, 3b supporting the mother glass board 5 are formed with a prescribed gap 7 between the supporting members 3a, 3b facing each other. The hand 4 is comprised of a plurality of transverse hand supporting members 41 disposed between parallel supporting members 3a or 3b and a longitudinal hand supporting member 42 disposed between the supporting members 3a, 3b facing each other and connecting the transverse hand supporting members 41 to each other, at the insertion position of the hand 4, as shown in FIG. 4, making it possible to extend the supporting members 3a, 3b near the center of the mother glass board 5. A large mother glass board 5 can thereby be stored in such a way as to reduce the amount of its dead weight deflection and prevent deformation or breakage of the mother glass board 5 due to bending stress during storage.

In addition, by forming the hand 4 of the transfer machine, at the insertion position of the hand 4, with a plurality of transversal hand supporting members 41 in the direction of breadth disposed between parallel supporting members 3a or 3b, and a longitudinal hand supporting member 42 disposed between the supporting members 3a, 3b facing each other and connecting the transverse hand supporting members 41 to each other, it becomes possible to increase the dimension L in the direction of breadth of the hand 4 up to around the end of the mother glass board 5. A large mother glass board 5 can thereby be stored in such a way as to reduce the amount of its dead weight deflection and prevent deformation or breakage of the mother glass board 5 due to bending stress at the time of transfer.

It should be noted that the transfer device for substrate of this embodiment can effectively store and transfer a liquid crystal mother glass board 5 of 1200×1000 mm or so in size, and also of no less than 2000×1700 mm, if required.

Figure 6:
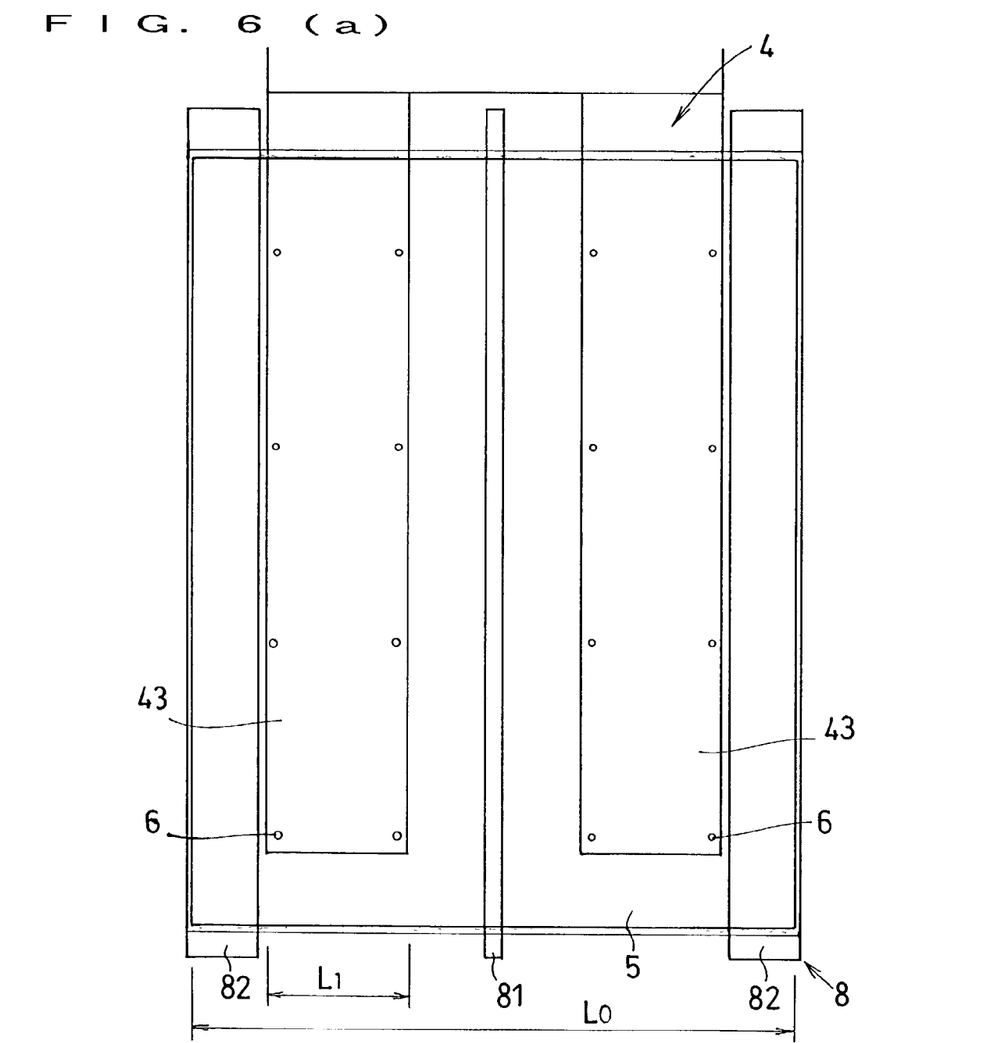
FIG. 6 indicates the state of transfer to a pedestal by a transfer device in a fourth embodiment of the transfer device for a substrate according to the present invention, FIG. 6(*a*) being a plan view omitting the top plate, and FIG. 6(*b*) being a front elevation.

Furthermore, by forming the longitudinal hand supporting members 42 of the hand 4 in such a way as to be split into left and right sides, it becomes possible to increase the rigidity of the hand 4, by reducing the load on the respective longitudinal hand supporting members 42, and to also perform the transfer of a mother glass board 5 in adaptation to a pedestal 8 provided with an auxiliary supporting member 81 longitudinally at the center as a storage device, as shown in FIGS. 5 and 6, for example.

This pedestal 8 is intended to support a mother glass board 5 with both left and right supporting members 82 and the auxiliary supporting member 81 at the center. FIG. 6 indicates the transfer of a mother glass board 5 by a pair of wide (having a dimension $L_1$ in the direction of breadth no less than 20% of the dimension of breadth $L_0$ of mother glass boards 5) longitudinal hand supporting members 43 provided in parallel with a gap in the direction of breadth to the pedestal 8. As shown in this embodiment, the transverse hand supporting members 41 may be omitted in a case where the longitudinal hand supporting members 43 are formed with a large width.

Figure 7:
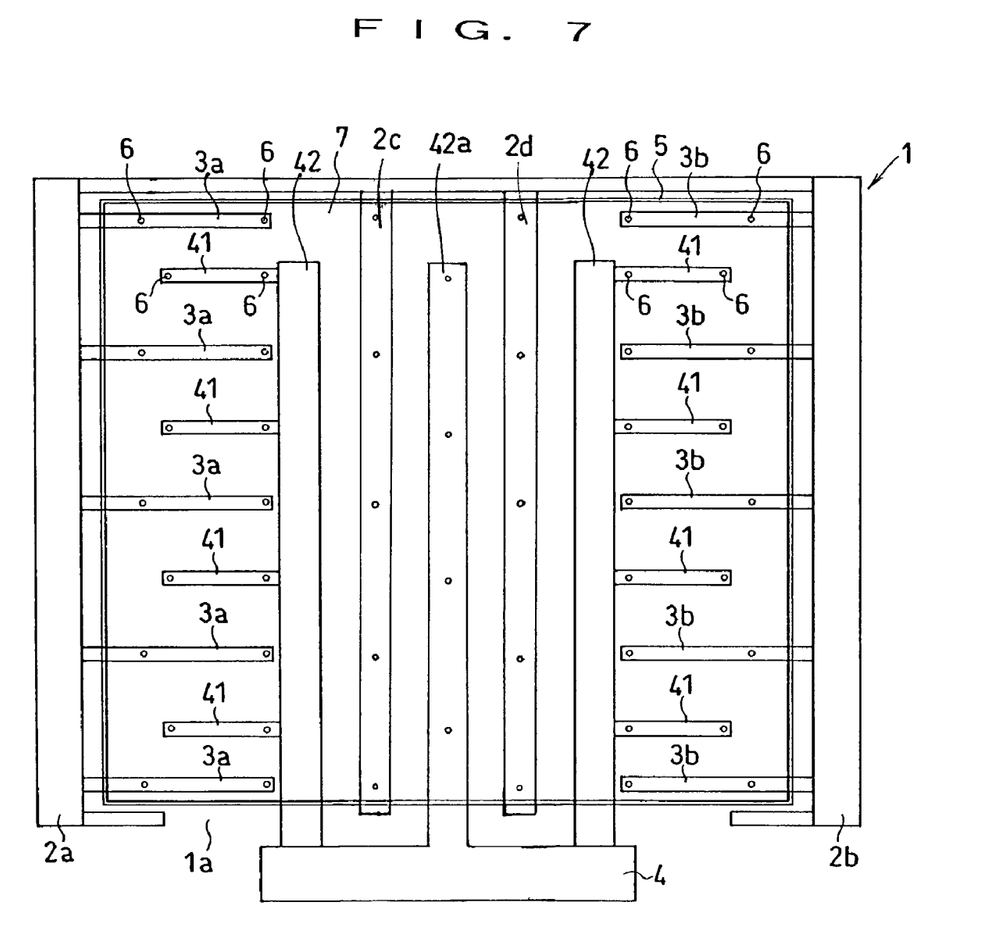
FIG. 7 is a plan view showing a state of transfer to a cassette body by a transfer device in a fifth embodiment of the transfer device for a substrate according to the present invention, omitting a top plate.
Figure 8:
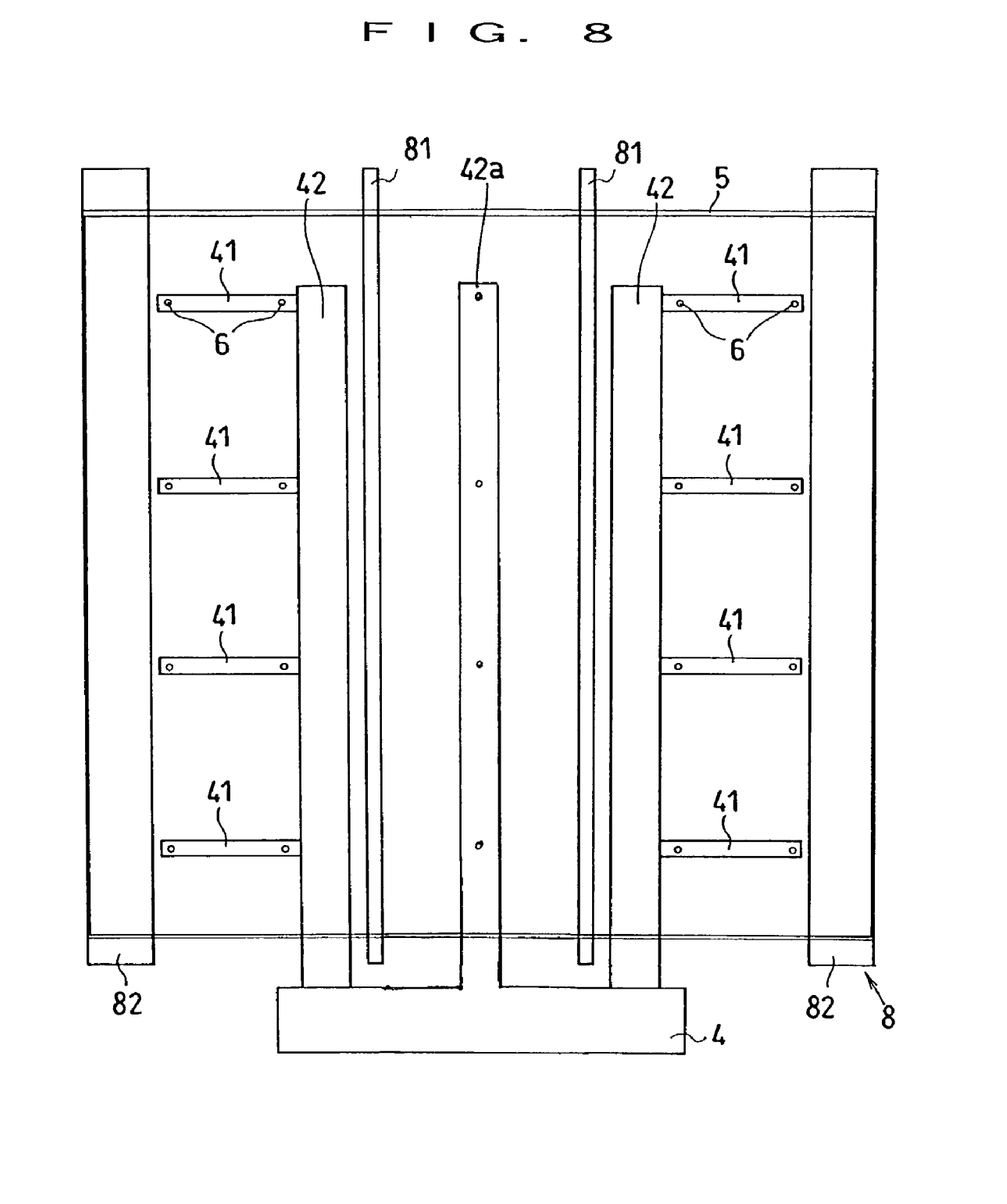
FIG. 8 is a plan view showing the state of transfer to a pedestal by the same transfer device as above.

In addition, as shown in FIGS. 7 and 8, it is possible to provide either one or more auxiliary longitudinal hand supporting members 42a between a pair of wide longitudinal hand supporting members 42 in parallel with the latter, or to provide one or more auxiliary supporting members 2c, 2d, 81 in parallel, at an intermediate position of the supporting members 2a, 2b, 82 provided in extension in opposite directions from both sides of the cassette body 1 or the pedestal 8 as storage device.

As described above, by providing auxiliary longitudinal hand supporting member 42a and auxiliary supporting members 2c, 2d, 81 in parallel, it becomes possible to handle mother glass boards 5 of a larger size.

The transfer device for substrate according to the present invention has so far been explained based on a plurality of embodiments. However, the present invention is not limited to the constructions described in the embodiments, and its construction can be modified as desired to the extent in which it does not deviate from its purpose, by either combining as required the constructions described in the respective embodiments (applying the construction of the cassette body as a storage device to the pedestal or, conversely, applying the construction of the pedestal as a storage device to the cassette body), etc. Moreover, the device for handing over a substrate with the transfer machine is not restricted to cassettes or pedestals, and the object of transfer can also be applied widely to substrates other than mother glass boards.

According to the transfer device for a substrate and storing device therein of the present invention, it becomes possible to expand the supporting (area) of the substrate by the supporting member of the storage device or the hand supporting member of the transfer machine to a wide range of the substrate, preventing deformation or breakage of the substrate due to bending stress by reducing the amount of dead weight deflection of a large-sized substrate, thereby enabling the acquisition of a high-quality processed substrate product.

The invention claimed is:

1. A transfer device for mother glass boards, comprising:
   a storing device comprising a first storage unit and a second storage unit;
   wherein said first storage unit comprises a plurality of supporting members extending in parallel in a direction of breadth from two sides of said first storage unit, said plurality of supporting members including supporting members positioned to be opposed to each other and having a gap between them;
   wherein said second storage unit comprises left and right supporting members and at least one auxiliary supporting member disposed at an intermediate position between said left and right supporting members; and
   a transfer machine having a hand comprising a plurality of transverse hand supporting members extending in a direction of breadth and which can pass between said supporting members of said first storage unit and at least two longitudinal supporting members that are provided side by side with a gap in between in the direction of breadth and connecting said plurality of transverse hand supporting members to each other;
   wherein mother glass boards can be introduced to or removed from said first storage unit and said second storage unit by raising and lowering said hand of said transfer machine between said plurality of supporting members of said first storage unit and said left and right supporting members of said second storage unit.

2. The transfer device of claim 1, wherein said gap between said longitudinal supporting members is wider in the direction of breadth than said at least one auxiliary supporting member in order to allow said auxiliary supporting member to fit between said longitudinal supporting members.

3. The transfer device of claim 1, wherein said at least two longitudinal supporting members of said hand comprises an auxiliary longitudinal hand supporting member between two of said longitudinal supporting members.

4. The transfer device of claim 3, wherein said at least one auxiliary supporting member comprises two auxiliary supporting members spaced apart so as to each be capable of being received between one of two of said longitudinal supporting members and said auxiliary longitudinal hand supporting member.

5. The transfer device of claim 1, wherein said supporting members of each of said first storage unit, said second storage unit and said hand comprise cushioning members for directly supporting the mother glass board.

6. The transfer device of claim 1, wherein said first storage unit has said opposed supporting members thereof provided with the same structure in a plurality of vertically separated stages to support a plurality of mother glass boards therein.

7. The transfer device of claim 1, wherein each of said first storage unit, said second storage unit and said hand are sized to handle mother glass boards having a size no smaller than 1200×1000 mm.

8. The transfer device of claim 7, wherein each of said first storage unit, said second storage unit and said hand are sized to handle mother glass boards having a size no smaller than 2000×1700 mm.

9. A transfer device for mother glass boards, comprising:
   a storage unit comprising a plurality of supporting members extending in parallel in a direction of breadth from two sides of said first storage unit, said plurality of supporting members including a plurality of supporting members positioned to be opposed to each other and having a gap between them on the same vertical level; and
   a transfer machine having a hand comprising a plurality of transverse hand supporting members extending in a direction of breadth and which can pass vertically between said supporting members of said first storage unit and at least two longitudinal supporting members that are provided side by side, fixed with respect to each other, and have a gap in between in the direction of breadth, said at least two longitudinal supporting members each having some of said plurality of transverse hand supporting members connected and fixed thereto such that all of said plurality of transverse hand supporting members are fixed with respect to each other;
   wherein mother glass boards can be introduced to or removed from said storage unit by raising and lowering said hand of said transfer machine between said plurality of supporting members of said storage unit.

10. The transfer device of claim 9, wherein said at least two longitudinal supporting members of said hand comprises an longitudinal hand supporting member between two of said longitudinal supporting members.

11. The transfer device of claim 9, wherein said supporting members of said storage unit comprise cushioning members for directly supporting the mother glass board.

12. The transfer device of claim 9, wherein said storage unit has said opposed supporting members thereof provided with the same structure in a plurality of vertically separated stages to support a plurality of mother glass boards therein.

13. The transfer device of claim 9, wherein each of said storage unit and said hand are sized to handle mother glass boards having a size no smaller than 1200×1000 mm.

14. The transfer device of claim 13, wherein each of said storage unit and said hand are sized to handle mother glass boards having a size no smaller than 2000×1700 mm.

* * * * *